(12) United States Patent
Van de Kerkhof (10) Patent No.: US 11,287,753 B2
(45) Date of Patent: Mar. 29, 2022

(54) CLEANING APPARATUS AND METHODS OF CLEANING

(71) Applicant: ASML Netherlands B.V., Veldhoven (NL)

(72) Inventor: Marcus Adrianus Van de Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/965,635

(22) PCT Filed: Jan. 22, 2019

(86) PCT No.: PCT/EP2019/051408
§ 371 (c)(1),
(2) Date: Jul. 29, 2020

(87) PCT Pub. No.: WO2019/162013
PCT Pub. Date: Aug. 29, 2019

(65) Prior Publication Data
US 2021/0048757 A1  Feb. 18, 2021
US 2021/0333723 A9  Oct. 28, 2021

(30) Foreign Application Priority Data
Feb. 23, 2018 (EP) .................... 18158386

(51) Int. Cl.
*G03F 7/20* (2006.01)
*G03F 1/82* (2012.01)

(52) U.S. Cl.
CPC ............ *G03F 7/70925* (2013.01); *G03F 1/82* (2013.01); *G03F 7/70858* (2013.01)

(58) Field of Classification Search
CPC ..... G03F 7/70925; G03F 7/70341; G03F 1/82
(Continued)

(56) References Cited

U.S. PATENT DOCUMENTS 5,725,154 A  3/1998 Jackson
6,781,673 B2 *  8/2004 Moors ................. G03F 7/70558
355/76

(Continued)

FOREIGN PATENT DOCUMENTS

WO  2001074538  10/2001

OTHER PUBLICATIONS

Guillaume Roesch, European International Searching Authority, International Search Report and Written Opinion, corresponding PCT Application No. PCT/EP2019/051408, dated May 16, 2019, 10 pages total.

*Primary Examiner* — Hung Nguyen
(74) *Attorney, Agent, or Firm* — DiBerardino McGovern IP Group LLC (57) ABSTRACT

The present application relates to a carbon dioxide snow cleaning apparatus comprising: a carbon dioxide source; a carbon dioxide snow nozzle in fluid communication with the carbon dioxide source; a charging element; and a collection surface. Also described is a method of cleaning a surface, the method comprising the steps of: (i) passing a stream of carbon dioxide out of a carbon dioxide snow nozzle to form a carbon dioxide snow stream; (ii) charging the carbon dioxide snow stream; (iii) directing the charged carbon dioxide snow stream onto the surface to be cleaned; (iv) collecting particles removed by the charged carbon dioxide snow stream from the surface to be cleaned on a collection surface. Also described is the use of such apparatus in a lithographic apparatus and the use of such an apparatus or method.

22 Claims, 3 Drawing Sheets

(58) Field of Classification Search
USPC .................................................. 355/30, 53
See application file for complete search history.

(56) References Cited

U.S. PATENT DOCUMENTS

| | | | |
|---|---|---|---|
| 9,947,571 B2* | 4/2018 | Takano | B24C 1/003 |
| 2005/0121144 A1 | 6/2005 | Edo et al. | |
| 2006/0072085 A1* | 4/2006 | Compen | G03F 7/707 |
| | | | 355/30 |
| 2008/0302390 A1 | 12/2008 | Rastegar | |
| 2012/0066841 A1* | 3/2012 | Matthews | C11D 3/04 |
| | | | 8/137 |
| 2012/0247504 A1* | 10/2012 | Nasr | G03F 1/82 |
| | | | 134/1.1 |
| 2013/0306101 A1 | 11/2013 | Swanson et al. | |

\* cited by examiner

CLEANING APPARATUS AND METHODS OF CLEANING

CROSS-REFERENCE TO RELATED APPLICATIONS

This application claims priority of EP application 18158386.5 which was filed on Feb. 23, 2018 and which is incorporated herein in its entirety by reference

FIELD

The present invention relates to cleaning apparatus and methods for cleaning. In particular, the present invention relates to apparatus and methods for cleaning lithographic apparatus, more particularly for cleaning a patterning device, and even more particularly, for cleaning reticles for EUV lithography apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern from a patterning device (e.g. a mask or reticle) onto a layer of radiation-sensitive material (resist) provided on a substrate.

To project a pattern on a substrate, a lithographic apparatus may use electromagnetic radiation. The wavelength of this radiation determines the minimum size of features which can be formed on that substrate. A lithographic apparatus which uses extreme ultraviolet (EUV) radiation, having a wavelength within the range 4-20 nm, for example 6.7 nm or 13.5 nm, may be used to form smaller features on a substrate than a lithographic apparatus, which uses, for example, radiation with a wavelength of 193 nm.

In the lithographic apparatus, EUV radiation is generated by the ionisation of liquid tin droplets by a radiation source, such as a laser. The liquid tin droplets are passed in front of the radiation source and as the radiation hits the tin droplets, the tin droplets are ionised and release EUV radiation. One issue associated with generating EUV radiation in this way is that the tin may contaminate various parts of the lithographic apparatus, such as the patterning device.

A patterning device suitable for use in a lithography apparatus may be a reticle. Reticles may become contaminated with particles or contaminants from inside the lithography apparatus. The particles may contaminate one or more of the front side of the reticle, the back side of the reticle, and the sides and/or edges of the reticle. The particles may be generated by sources such as inorganic contaminants derived from the gases used in the lithographic apparatus, resist debris sputtered from the substrate during exposure, or mechanical contact between parts of the apparatus. The contaminants may comprise metal or metal oxide particles.

The problem of reticle contamination is particularly relevant to extreme ultraviolet (EUV) lithography. Protective elements may normally be used to protect the reticle from contamination within the lithography apparatus. However, in EUV lithography, due to the wavelength of the EUV radiation used, certain protective elements, such as a protective pellicle, cannot be easily used.

In EUV lithography apparatus, the collector mirror is a crucial component for high power output into the scanner. The close proximity of the collector mirror to the tin plasma, results in the collector being exposed to high loads of tin particulates. In the scanner there can be particulate contamination (e.g. tin, debris from pellicles, or debris from other components of the EUV lithography apparatus) of one or more of the scanner optics, the reticle, and the wafer.

In particular, reticle particle contamination is considered a problem as it can significantly reduce the yield of patterned devices produced. Contamination of the reticle may, for example, reduce the efficiency of EUV transmission to the substrate for patterning. The particles may absorb the EUV radiation or may also alter the reflectivity of the reticle, thereby affecting the reflection of the EUV radiation onto the substrate. As such, unacceptable defects in the pattern to be applied to the substrate the substrate can arise. Components of a lithography apparatus, or of pellicles, may be made of materials comprising inorganics, organics, metals, ceramics, or any other suitable material. As such, a patterning device, which may be a EUV reticle, can become contaminated with a wide range of material types.

Even a single particle on the reticle surface can drastically affect the pattern to be applied to the substrate, and particles as small as 50 nm or less can cause defects in the patterning process. Particles on an EUV reticle may absorb EUV radiation, thereby reducing or otherwise altering the reflectivity of the reticle. For example, the particles may also alter the angle at which the EUV radiation is reflected or refracted from the EUV reticle. As such, one or more of the efficiency, accuracy, and precision of the patterning process can be adversely affected, thereby leading to defects in the pattern applied to the substrate. These defects are only detected after the patterning of the substrate has been carried out, and the substrate is therefore already wasted. Therefore, for EUV reticles, the front of the reticle, along with the backside of the reticle and the sides/edges of the reticle, are important to keep clean: backside particles can cause overlay errors if they coincide with the clamping burls, and particles on the sides/edges can be transported to the reticle front side. During normal usage, a EUV reticle will therefore require cleaning from time to time, or on an as-needed basis.

Similarly, contamination of the collector leads to a reduced reflectivity of the collector. A consequence of this is that less of the incident EUV radiation is reflected by the collector and focused, thereby reducing the power of the EUV source. Due to the reduced power of the EUV source, a longer exposure is required during lithography, which reduces the throughput of the lithographic apparatus. If optical elements are contaminated, this will reduce their performance. If sensors are contaminated, this may adversely affect the sensitivity and/or accuracy of the sensors and may even render them inoperable.

Although the cleaning of patterning devices, such as reticles, used in EUV lithography apparatus is primarily discussed, it will be appreciated that the cleaning apparatus and methods of the present invention are applicable to a wide range of surfaces to be cleaned and may also be applied to collectors, optical elements, mirrors, sensors, and the like. Further, contaminants other than tin, such as but not limited to organics, inorganics, other metals and ceramics, may also be present on parts of the lithography apparatus, and therefore also require cleaning.

If the reticle does become contaminated, it must be removed from the lithography apparatus to be cleaned. Removing the reticle from the lithography apparatus is a time-consuming and difficult process that requires significant skill and expertise. Removing the reticle also increases the chances of the reticle becoming furtherly contaminated outside of the lithography apparatus. Furthermore, the reticle is extremely delicate. As such, there is a significant danger of causing irreparable damage to the reticle during external cleaning. Extreme care must therefore be taken when removing reticles from the lithography apparatus, and when cleaning said reticles outside of the lithography apparatus. Often, dedicated facilities are required for cleaning reticles, which can be extremely expensive.

In particular, the sides and edges of reticles are of concern for particle contamination as these are the locations where the reticle is handled during cleaning, whether by hand or by tools. As such, these areas of the reticle are particularly vulnerable to damage and cross-contamination.

There is therefore, a need to develop an apparatus and a method for cleaning reticles in situ i.e. within the lithography apparatus and without removing the reticle. Furthermore, there is a need to mitigate the risk of any contaminants removed from the surface to be cleaned, such as a reticle, contaminating other areas of the lithography apparatus.

It is known to use carbon dioxide snow to clean a wide variety of surfaces. Carbon dioxide can be used to clean surfaces via three different methods, namely using macroscopic dry ice pellets, snow streams spraying the surface to be cleaned with either microscopic or macroscopic carbon dioxide snow particles, or by using supercritical carbon dioxide.

In systems which use macroscopic dry ice pellets, cleaning is achieved by abrasive action and momentum transfer. The pellets are able to physically dislodge surface contaminants and the sublimation of the solid carbon dioxide (commonly referred to as 'dry ice') into gaseous carbon dioxide is able to push contaminants from the surface to be cleaned.

In systems which use supercritical carbon dioxide, the low viscosity of the supercritical fluid means that it is able to enter tight spaces where it can dissolve contaminants. Supercritical carbon dioxide is able to dissolve organic contaminants readily and is therefore used in the extraction of caffeine from coffee beans or nicotine from tobacco.

In systems which rely on carbon dioxide snow, the snow is generated by passing either liquid or gaseous carbon dioxide through an orifice. The drop in pressure as the liquid or gaseous carbon dioxide passes though and out of the orifice causes at least some of the carbon dioxide to solidify to form carbon dioxide "snow".

The use of snow cleaning is standard in many industries, such as the food industry and the manufacturing industry. However, it has not been feasible to use carbon dioxide snow cleaning to clean a reticle whilst the reticle is in situ within a lithographic apparatus since there is a risk of dislodged contaminants being re-deposited elsewhere within the lithographic apparatus.

In known snow cleaning apparatus, the carbon dioxide is passed out of a central nozzle which causes the carbon dioxide snow to form. Surrounding the central nozzle, there may be provided an annular flow of clean, dry air which assists in directing the flow of the carbon dioxide snow. In this way the flow of carbon dioxide snow is surrounded by an annular curtain of clean, dry air. The carbon dioxide snow may be directed to the surface to be cleaned by the flow of clean, dry air. The carbon dioxide snow then sublimes on the surface to be cleaned, thereby removing the particle contaminants.

In other carbon dioxide snow cleaning systems, there is no additional flow of clean, dry air. However, in known methods, these particles are simply blown by the carbon dioxide snow stream and the air stream away from the surface to be cleaned. Therefore, the particles that have been removed may simply contaminate another surface of the lithography apparatus.

Whilst the present application generally refers to EUV lithography apparatus throughout and particularly EUV lithography reticles, the invention is not limited to solely EUV lithography apparatus and it is appreciated that the subject matter of the present invention may be used to clean any surface of any lithography apparatus, in particular any collector, optical element, mirror, reflective surface, wall, and sensor or similar in the lithography apparatus.

SUMMARY

The present invention has been made in consideration of the aforementioned problems with known methods of cleaning lithography apparatus, in particular EUV lithography apparatus and even more particularly, optical elements of EUV lithography apparatus including patterning devices such as reticles, mirrors, reflective surfaces, collectors, walls and sensors used in the EUV lithography apparatus.

According to a first aspect of the present invention, there is provided a carbon dioxide snow cleaning apparatus comprising: a carbon dioxide source; a carbon dioxide snow nozzle in fluid communication with the carbon dioxide source; a charging element; and a collection surface.

It has been surprisingly found that charging the carbon dioxide snow stream, such that the carbon dioxide snowflakes are charged, or a component of the carbon dioxide snow stream is charged, improves the efficiency of removing particles from the surface to be cleaned, in particular metallic particles, although non-metallic particles may also be used. The charging element charges the carbon dioxide snow stream, and this charge is passed on to the surface being cleaned and the particles being released. The collection surface is preferably oppositely charged compared to the charged carbon dioxide stream. The collection surface, which is preferably oppositely charged to the carbon dioxide snow stream, will then attract and collect particles or contaminants which are dislodged by the carbon dioxide snow and thereby prevent them from contaminating other areas or parts of a lithographic apparatus.

Previously carbon dioxide snow cleaning has only been used to clean off contaminants/particles which are only loosely adhered to the surface to be cleaned or which are not in themselves particularly robust, such as paint. It has been surprisingly found that carbon dioxide snow cleaning is particularly suitable for cleaning contaminants/particles from a EUV reticle, which may be more strongly adhered to the EUV reticle surface. The terms 'particle' and 'contaminant' are used interchangeably throughout this text.

It has also been surprisingly found that by charging the carbon dioxide snow stream, the particles removed from the EUV reticle surface may also become charged. Without wishing to be bound by theory, it is presumed that a charge transfer occurs between the carbon dioxide molecules and the contaminants on the surface to be cleaned. Of particular concern when using carbon dioxide snow cleaning to clean the sides and edges of EUV reticles is simply re-depositing on the front side of the reticle. The collection surface prevents the contaminants from being transferred to another area of the lithography apparatus or from being deposited onto another surface of the reticle, thereby reducing the risk of further contamination. Prior to the present invention, efforts were made to avoid charge being built up on the carbon dioxide snow cleaning apparatus and the surface to be cleaned.

In some embodiments, the carbon dioxide snow nozzle has a single outlet through which carbon dioxide snow is expelled. Preferably, the single outlet is circular in shape, or is any other suitable shape. In other embodiments, the carbon dioxide snow nozzle comprises a plurality of outlets. Preferably, said plurality of outlets are arranged to be substantially linear with respect to each other. Alternatively, said plurality of outlets may be arranged to form an annular ring, a triangle, or any other shape desired.

The carbon dioxide snowflake has an overall charge equivalent to the sum of the charges of each charged carbon dioxide molecule therein. A carbon dioxide molecule within a carbon dioxide snowflake may be positively charged or negatively charged by the charging element. As such, the carbon dioxide snowflakes, and therefore the carbon dioxide snow stream, may be positively charged, or alternatively, negatively charged. The charge may be carried by the charging additive rather than the carbon dioxide itself. Since the carbon dioxide stream may comprise the charging additive, reference to the carbon dioxide stream being charged includes the case where it is the charging additive which carries the charge.

In some embodiments, the collection surface may be electrically charged. In other embodiments collection surface may alternatively be electrostatically charged. Electrical charging of the collection surface may allow a current to flow when charged particles contact the collection surface during cleaning. Electrostatic charging of the collection surface provides electrostatic attraction between the charged particles removed from the surface to be cleaned, and the collection surface. The collection surface might also be an uncharged conductive surface which will attract charged particles by the phenomenon of mirror charges.

The collection surface may be inbetween the carbon dioxide nozzle and the surface to be cleaned. The collection surface may be adjacent the carbon dioxide snow nozzle. As previously described, the collection surface prevents the particles from contaminating surrounding areas, such as other surfaces of a EUV lithography apparatus. The adjacent arrangement therefore reduces the risk of particles escaping from the surface to be cleaned to other areas, and maximises the probability of the collection surface capturing the particle. The collection surface may substantially surround the carbon dioxide snow nozzle. The collection surface may therefore create an enclosed area, within which the particles removed during cleaning are contained. The collection surface may be of any suitable shape and may be substantially planar, curved, or have a more complex geometry.

Preferably, the collection surface is positioned substantially in the path of at least a portion of the particles or contaminants removed from the surface to be cleaned. In this way, the first surface which the particles or contaminants meet is the collection surface rather than a surface of the lithography apparatus itself. The collection surface may be stationary. The collection surface may move with the carbon dioxide nozzle or to take account of the movement of the carbon dioxide nozzle. For example, the collection surface may be in a fixed position relative to the carbon dioxide nozzle such that as the carbon dioxide nozzle moves, the collection surface moves in the same way. The collection surface may be able to move independently of the carbon dioxide nozzle. It will be appreciated that when the angle of the carbon dioxide nozzle relative to the surface to be cleaned is changed, the trajectory of the particles removed from the surface is also changed. The collection surface may therefore be moved such that it remains substantially in the path of the particles which have been removed from the surface being cleaned.

The collection surface may be continuous or may be discontinuous. There may be more than one collection surface.

In some embodiments, the charging element is a source of electrons, a source of ionizing radiation, a plasma source, or a triboelectric charging surface. Any of these charging element types are suitable for charging the carbon dioxide snow stream, particularly for charging the carbon dioxide molecules which constitute the carbon dioxide snow stream. The charging of the carbon dioxide snow stream may be achieved by carbon dioxide ionization, ionizing dissociation or by any other suitable means. Indeed, any method which is able to charge the carbon dioxide stream may be utilised.

It will be appreciated that, although a single charging element is referred to, a plurality of charging elements may be employed in the present invention. Furthermore, a plurality of different types of charging elements may be employed in the present invention if desired.

In some embodiments, the carbon dioxide snow may require direct contact with a charging portion of the charging element 14, in order to become charged. It may therefore be desirable to ensure that the temperature of the charging portion of the charging element is maintained at a suitable temperature such that the carbon dioxide snowflakes do not melt. Similarly, it may be desirable to provide a heating element in order to avoid build-up of carbon dioxide snow at a particular point in the apparatus. The charging element, may therefore, be provided with a cooling element to maintain it at a decreased temperature and/or a heating element to heat it up.

The collection surface may be conductive. In particular, the collection surface may be an electrode connected to a voltage source. The voltage source may be a battery or any other suitable means of voltage. The electrode can be made of any suitable material such as, but not limited to, copper, aluminium, iron, or steel.

The collection surface may be an intrinsically electrostatic material. For example, an electret, which is a stable dielectric material with a permanent static charge and/or permanent dipole polarisation, may be suitable for use as a collection surface according to the present invention.

The collection surface may be magnetic. In some embodiments, the collection surface may be an electromagnet. In other embodiments, the collection surface may be a permanent magnet. Although metallic tin is weakly paramagnetic, ionized tin particles, for example, may be strongly ferromagnetic and therefore strongly attracted to a magnetic collection surface.

As the charged carbon dioxide snow stream contacts the surface to be cleaned, a net charge may begin to build up on the surface to be cleaned. Such a build-up of charge may be dangerous if the charge is suddenly dissipated away from the surface, and could possibly damage the surface to be cleaned, particularly if the surface is a delicate EUV reticle. In embodiments, it may therefore be desirable to measure the charge of the surface to be cleaned in real time, to ensure the charge does not exceed a critical level.

Therefore, if desired, the charge sign of the carbon dioxide snow stream, as determined by the charging element may be switched. This may be done by switching from one charging element to another charging element, by switching the electrical current of the charging element, or by any other suitable method. In this way, the charge that builds up on the surface to be cleaned through contact with the charged carbon dioxide snow stream can be reduced, neutralised, or even reversed. It may, in some circumstances, then be necessary to alter the potential sign of the collection surface to account for the changed charge of the carbon dioxide snow stream, and therefore of the particles removed from the surface to be cleaned. In some embodiments, build up, or accumulation, of charge on the surface to be cleaned may be prevented by either open-loop or closed-loop circuits. In some embodiments, the surface to be cleaned may be neutralised by contacting the charged surface to be cleaned with ionized gas, or any other suitable de-charging method.

In some embodiments, the charge signs of the carbon dioxide snow stream, as determined by the charging element, and the collection surface, can be synchronously be switched. Preferably, the charge signs of the carbon dioxide snow stream and the collection surface are alternated throughout the cleaning process, to prevent an overall charge build-up on the surface to be cleaned.

The apparatus may comprise a vacuum nozzle through which carbon dioxide gas and contaminants may be withdrawn from the apparatus.

In some embodiments, the carbon dioxide snow cleaning apparatus further comprises a charging additive source to provide a charging additive. Preferably, the charging additive becomes charged by the charging element. Preferably, the carbon dioxide snow stream comprises the charging additive. The charging additive can advantageously carry additional charge as part of the carbon dioxide snow stream, or separately and therefore acts as a supplemental charge carrier to the carbon dioxide in the carbon dioxide snow stream. Indeed, it is contemplated that the carbon dioxide itself carries no or only minimal charge, and that it is the charging additive which is charged by the charging element. The charging additive may be selected from the group comprising water, ice, methanol, ethanol, isopropanol, and propanol, or any other suitable additive. A charging additive is suitable if it is able to be charged more readily than carbon dioxide and/or it is able to retain a charge for longer than carbon dioxide. In addition, the charging additive must be substantially inert to the surface being cleaned, namely, the charging additive must not chemically react with the surface to be cleaned under carbon dioxide snow cleaning conditions. The charging additive must be sufficiently volatile that it is able to be removed from the surface to be cleaned with no or only minimal heating.

In some embodiments, the charging element is adjacent the carbon dioxide snow nozzle. As the carbon dioxide snow stream exits the carbon dioxide snow nozzle, the charging element is adjacent, therefore aiding charge transfer to the carbon dioxide snowflakes and/or the charging additive. In some embodiments the charging element substantially surrounds the carbon dioxide snow nozzle. In such embodiments the charging element therefore also substantially surrounds the carbon dioxide snow stream as it exits the carbon dioxide snow nozzle, thereby increasing the surface area of the charging element which may charge the carbon dioxide snow stream.

The charging element may be any suitable source of electrons, such as, but not limited to, an electron beam gun or an electron gun. Preferably, the free electrons are directed toward the carbon dioxide snow stream with sufficient energy to charge the carbon dioxide snow stream. The carbon dioxide snow stream may, for example, be charged by means of electron ionisation.

The charging element may alternatively be any other suitable means for charging the carbon dioxide snow stream, either positively or negatively.

In some embodiments, the carbon dioxide snow cleaning apparatus comprises a gas stream substantially surrounding the carbon dioxide snow nozzle. The gas stream may therefore direct the carbon dioxide snow stream towards the surface to be cleaned. Preferably at least a portion of the gas stream is situated between the carbon dioxide snow nozzle and the collection surface. Preferably, the carbon dioxide snow cleaning apparatus also comprises a heater for heating the gas stream. The surface to be cleaned therefore experiences significant changes in temperature from the carbon dioxide snow stream, to the heated gas stream, which may aid in removing particles from the surface to be cleaned.

A heated gas stream may accelerate the rate and efficiency at which the particles are removed from the surface to be cleaned. In use, the carbon dioxide snow cleaning apparatus is passed across the surface to be cleaned. A first portion of the gas stream passes over the particle and heats the particle. This causes the particle to expand as it heats up and the particle will heat up more quickly than the underlying EUV reticle meaning that they will expand at different rates, thus loosening the bond between the contaminant and the surface to be cleaned. As the apparatus continues to pass across the surface to be cleaned, and as the carbon dioxide snow comes into contact with the particle, the particle will rapidly cool and further weaken the bond between the particle and the EUV reticle. The carbon dioxide snow will also physically dislodge the particle and push it away from the EUV reticle. As the apparatus continues to pass across the EUV reticle, a second portion of the gas stream will pass across the area where the particle was previously located and will warm the surface to be cleaned up in order to avoid overcooling of the surface to be cleaned and possible water ice or condensation formation.

In some embodiments, the carbon dioxide snow cleaning apparatus comprises a voltage source wherein a voltage is applied between the collection surface and the carbon dioxide snow nozzle.

The collection surface is preferably oppositely charged to the carbon dioxide snow stream, such that the particles which gain the charge from the carbon dioxide snow stream are attracted to the collection surface. The collection surface may be grounded such that charged particles which meet the collection surface are able to collect on the surface, but such that the charge does not build up on the collection surface. A conductive grounded collection surface will still attract charged particles by the mirror charge effect.

According to a second aspect of the present invention, there is provided a method of cleaning a surface, the method comprising the steps of:
(i) passing a stream of carbon dioxide out of a carbon dioxide snow nozzle to form a carbon dioxide snow stream;
(ii) charging the carbon dioxide snow stream;
(iii) directing the charged carbon dioxide snow stream onto the surface to be cleaned;
(iv) collecting particles removed by the charged carbon dioxide snow stream from the surface to be cleaned on a collection surface.

In some embodiments, the method requires the collection surface to be electrically charged. In other embodiments, the method requires the collection surface to be electrostatically charged. In other embodiments, the method requires the collection surface to be conductive to create attraction by mirror charge effect.

In some embodiments, the carbon dioxide snow stream is charged by a source of electrons, a source of ionizing radiation, a plasma source with the carbon dioxide snow stream being passed through at least a portion of the plasma of the plasma source, or by impingement with a triboelectric charging surface.

In some embodiments, the method further comprises providing a charging additive. Preferably, the charging additive is charged by at least one of a source of electrons, a source of ionizing radiation, a plasma source, or impingement with a triboelectric charging surface. Preferably, the charging additive is selected from the group comprising water, ice, methanol, ethanol, isopropanol and propanol, or any other suitable additive.

In some embodiments, the method further comprises providing a gas stream, the gas stream directing the carbon dioxide snow stream onto the surface to be cleaned. Preferably, the gas stream is provided by an outlet which substantially surrounds the carbon dioxide snow nozzle. Preferably the outlet is situated between the carbon dioxide snow nozzle and the collection surface. The gas stream may also be heated.

In some embodiments of the method according to the second aspect of the present invention, a voltage is applied between the collection surface and the carbon dioxide snow nozzle, wherein the voltage is supplied by a voltage source.

In some embodiments of the method according to the second aspect of the present invention, the surface to be cleaned is moved with respect to the carbon dioxide snow stream or nozzle during cleaning. In other embodiments, the carbon dioxide snow stream or nozzle is moved with respect to the surface to be cleaned.

The method according to the second aspect of the present invention can be employed to clean a surface of a EUV lithography apparatus, in particular scanner optics, sensors, collectors, walls or any other surface according of the EUV lithography apparatus desired.

In some embodiments of the method according to the second aspect of the present invention, the surface to be cleaned is a surface of a lithographic apparatus, which may be a EUV lithography apparatus. The surface to be cleaned may be a EUV reticle of a EUV lithography apparatus. The surface to be cleaned may be one or more of the front side of the EUV, the backside of the EUV reticle and the sides of the EUV reticle. Preferably, the EUV reticle is cleaned inside the EUV lithography apparatus.

The method according to the second aspect of the present invention or the carbon dioxide snow cleaning apparatus according to the first aspect of the present invention may be used to clean a surface of a lithographic apparatus, which may be a EUV lithography apparatus. The surface of the lithographic apparatus may be a EUV reticle. The surface of the lithographic apparatus may be one or more of the front side of the reticle, the backside of the reticle and the sides of the reticle.

The method according to the second aspect of the present invention may comprise inspecting the surface to be cleaned in situ. Cleaning may be actioned when a level of contaminants reaches or exceeds a predetermined level. The predetermined level may be selected, for example, to be a level of contaminants approaching the level at which the integrity and/or shape of the beam may be affected. It is desirable to clean the reticle before such a level is reached. The cleaning may also be carried out at set intervals. The set intervals may be based on, for example, numbers of hours of run time or the number of wafers imaged.

According to a third aspect of the present invention, there is provided a lithographic apparatus comprising a carbon dioxide snow cleaning apparatus as defined in the first aspect of the present invention. Advantageously, parts of the lithographic apparatus, such as a EUV reticle, may be cleaned in situ within the lithographic apparatus. This has the advantage of reducing the risk of inadvertent damage to the reticle during removal and re-installation. This also reduces the down time, i.e. the time when the apparatus is not able to be used, of the lithographic apparatus.

Another significant benefit of cleaning the EUV reticle inside the lithography apparatus is that the reticle is kept inside the ultra-clean environment inside the scanner itself and limits handling of the reticle. The in situ cleaning may be carried out either in a dedicated part of the lithography apparatus, in the reticle library of the lithography apparatus of whilst the reticle is in use on the reticle stage.

According to a fourth aspect of the present invention, there is provided the use of the apparatus according to the first aspect of the present invention or the method according to the second aspect of the present invention to clean a surface of a lithographic apparatus. The surface may be a reticle of a lithographic apparatus. The surface is one or more of the front side of the reticle, the backside of the reticle, and the sides of the reticle. The lithographic apparatus may be an EUV lithographic apparatus.

The features disclosed in respect of any aspect of the present invention may be combined with one or more features of any other aspect of the present invention. All such combinations are expressly disclosed.

BRIEF DESCRIPTION OF THE DRAWINGS

Embodiments of the invention will now be described, by way of example only, with reference to the accompanying schematic drawings, in which.

DETAILED DESCRIPTION

Figures 1, 2A:
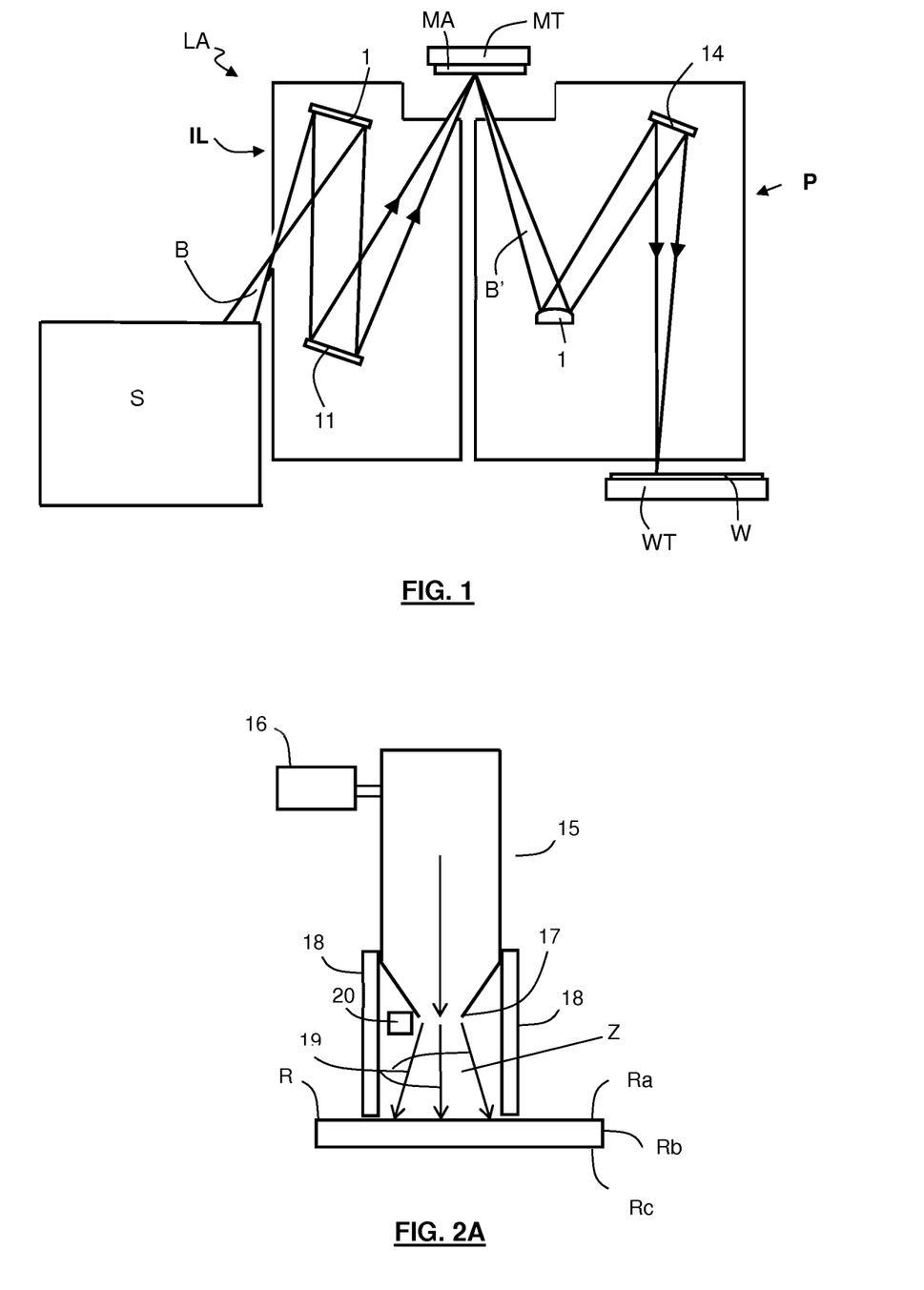
FIG. 1 depicts a lithographic system comprising a lithographic apparatus and a radiation source which may be cleaned using the apparatus and/or methods of the present invention.
FIG. 2A is a schematic depiction of the carbon dioxide snow cleaning apparatus according to the first aspect of the present invention.

FIG. 1 shows a lithographic system including a EUV reticle which may become contaminated with tin or with other contaminants, and thereby require cleaning using the apparatus or methods of the present invention. The lithographic system comprises a radiation source SO and a lithographic apparatus LA. The radiation source SO is configured to generate an extreme ultraviolet (EUV) radiation beam B and to supply the EUV radiation beam B to the lithographic apparatus LA. The lithographic apparatus LA comprises an illumination system IL, a support structure MT configured to support a patterning device MA (e.g. an EUV reticle), a projection system PS and a substrate table WT configured to support a substrate W.

The illumination system IL is configured to condition the radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus aligns the patterned radiation beam B with a pattern previous formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Although EUV reticles are referred to in the following description, any suitable patterning device MA may be used. An EUV reticle is very complex, having a multilayer reflective coating and an absorber pattern on top. As such, the incidence EUV radiation is only reflected on surfaces which are reflective, thereby creating the pattern to be applied to the substrate. The EUV reticle may also comprise a capping layer which protects the surface of the multilayer reflective coating and absorber pattern.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Figure 2B:
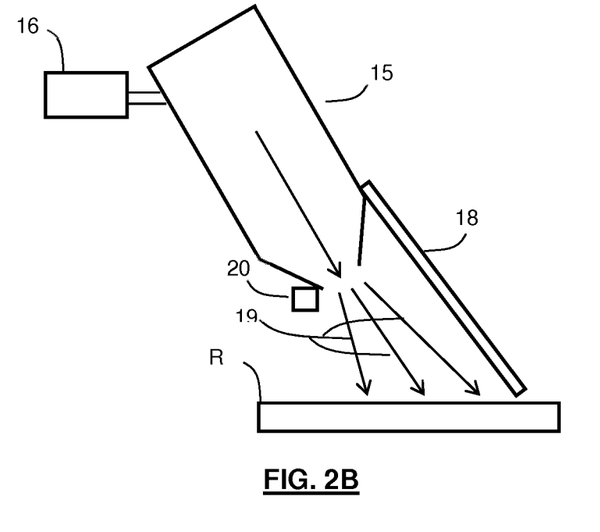
FIG. 2B is a schematic depiction of the carbon dioxide snow cleaning apparatus according to the first aspect of the present invention.

FIGS. 2A and 2B show schematic illustrations of a carbon dioxide cleaning apparatus 15 in accordance with the first aspect of the present invention in cross-section. A carbon dioxide source 16, which may be a cylinder of liquid carbon dioxide or any other suitable source, is connected to a carbon dioxide snow nozzle 17. The carbon dioxide source 16 is in fluid connection with the carbon dioxide snow nozzle 17 to allow carbon dioxide to pass from the carbon dioxide source and out of the nozzle 17. As the carbon dioxide stream passes out of the carbon dioxide snow nozzle 17 and into zone Z, the liquid carbon dioxide expands and at least partially freezes forming a carbon dioxide snow stream 19. A charging element 20 and a collection surface 18 for collecting the particles removed from the surface to be cleaned are also provided. The location of the charging element 20 is depicted schematically and it may be provided in any suitable location. In the embodiment shown in FIG. 2A, the collection surface 18 is shown as substantially surrounding the carbon dioxide nozzle, but it will be appreciated that other configurations are contemplated.

Once the carbon dioxide snow has formed, it may be charged by charging element 20. The carbon dioxide snow typically comprises a plurality of carbon dioxide snowflakes. One or more of the carbon dioxide molecules, which collectively comprise a carbon dioxide snowflake, may become charged by the charging element 20.

Although charging of the carbon dioxide snow is described herein, it will be appreciated that the carbon dioxide may be also charged in its gaseous or liquid form, prior to precipitating as carbon dioxide snow on exit from the carbon dioxide snow nozzle. The charging element may, therefore, be situated inside the carbon dioxide snow nozzle, or be integral with the carbon dioxide snow nozzle, to charge the carbon dioxide either before it forms as carbon dioxide snow, or as it forms carbon dioxide snow. In FIGS. 2A and 2B, the charging element 20 is shown to be separate to the carbon dioxide snow nozzle 17 such that the carbon dioxide snow is charged as it exits the carbon dioxide snow nozzle 17.

The efficiency of the charging of the carbon dioxide snow stream 19 largely depends on the proximity of the charging element 20 to the carbon dioxide snow as it forms. It is therefore preferable to have the charging element in close proximity to the carbon dioxide snow as it forms. The charging element may, therefore, be placed at any appropriate position where the carbon dioxide snow can become charged. FIGS. 2A and 2B show a schematic embodiment of the apparatus according to the first aspect of the present invention wherein the charging element 20 is adjacent to the carbon dioxide snow nozzle.

Figure 4:
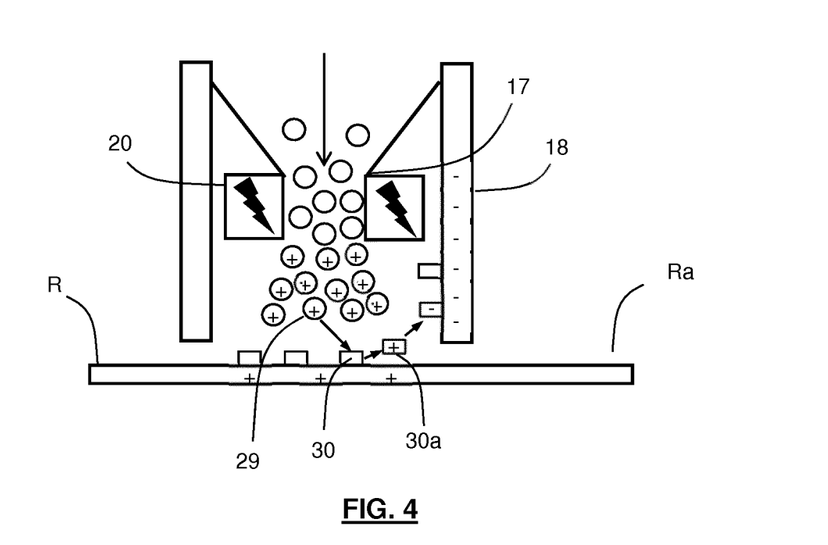
FIG. 4 is a schematic depiction of carbon dioxide snow cleaning and collection of particles, employing the carbon dioxide snow cleaning apparatus according to the first aspect of the present invention.

Preferably the charging element 20 substantially surrounds the carbon dioxide snow nozzle. For example, FIG. 4 shows a schematic illustration of a carbon dioxide snow cleaning apparatus 15 in accordance with the first aspect of the present invention in cross-section, wherein the charging element 20 forms an annular ring around the carbon dioxide snow nozzle 17. The annular charging element 20 ensures that as the carbon dioxide snow is formed, the largest possible surface area of the resulting carbon dioxide snowflakes is in the proximity of the charging element 20. As such the efficiency of the charging process of the carbon dioxide snow stream is increased.

In some embodiments, a voltage source is provided, and a voltage is applied between the carbon dioxide snow nozzle 17 and the collection surface 18. The charging element may be integral with the carbon dioxide snow nozzle. The collection surface 18 may be an electrically conductive surface, such as an electrode. The carbon dioxide snow nozzle 17 and collection surface 18 may therefore act as junctions in a broken circuit. The charging of the carbon dioxide snow stream on exit from the carbon dioxide snow nozzle, the charging of particles to be cleaned from a surface through contact with the carbon dioxide snow stream, and contact of said charged particles with the charged collection surface may complete the circuit, thereby allowing current to flow. Measurement of the current flowing in the circuit may be used as an indication of the number of particles removed from the surface to be cleaned, and thus may provide means for determining when cleaning of the surface to be cleaned is complete.

Once the carbon dioxide snow stream is charged, it is directed towards a surface to be cleaned to remove particles therefrom. FIGS. 2A and 2B are schematics showing carbon dioxide snow cleaning of the front side Ra of a EUV reticle R employing the apparatus according to the first aspect of the present invention. In FIGS. 2A and 2B, the EUV reticle R has a front side Ra, a backside Rc and sides/edged Rb. Although carbon dioxide snow cleaning of the front side Ra is illustrated, it will be appreciated that the carbon dioxide snow cleaning apparatus according to the first aspect of the present invention may be used to clean one or more of the front side Ra, the backside Rc and sides/edges Rb of the EUV reticle. The carbon dioxide snow may be directed towards the reticle at any desired angle, such as directly perpendicular as shown in FIG. 2A, or off perpendicular as shown in FIG. 2B, wherein perpendicular is defined as an angle of 90° between the axis of the carbon dioxide snow stream and the surface to be cleaned.

Figure 3:
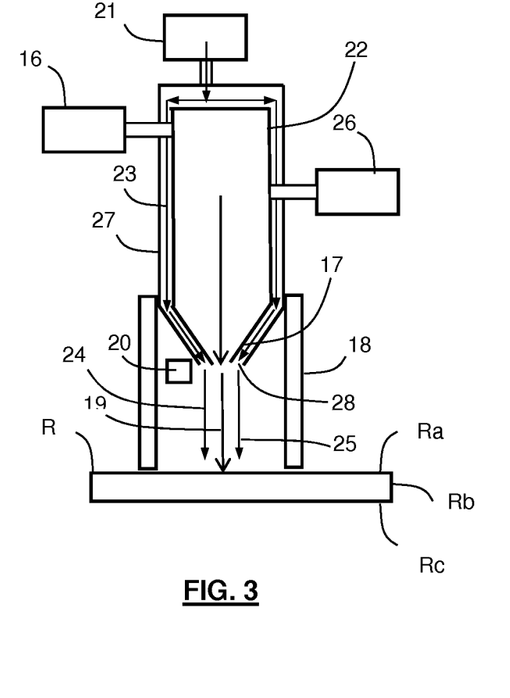
FIG. 3 is a schematic depiction of the carbon dioxide snow cleaning apparatus according to the first aspect of the present invention.

FIG. 3 shows a schematic illustration of a carbon dioxide snow cleaning apparatus 15 in accordance with the first aspect of the present invention in cross-section, wherein the apparatus 15 further comprises a source of gas 21. The gas source 21 is in fluid connection with the outer surface 22 of carbon dioxide snow nozzle 17 and the outer body 27 of the carbon dioxide snow cleaning apparatus. The gas stream 23 provided by the gas source 21 is contained within the outer body 27 of the carbon dioxide snow cleaning apparatus and the outer surface 22 of the carbon dioxide snow nozzle 17. The gas stream may only escape by means of aperture 28. As the carbon dioxide snow stream 19 forms at snow nozzle 17, the gas stream 23 escapes through aperture 28, directing the carbon dioxide snow stream 19 towards the surface to be cleaned. The aperture 28 is defined by the nozzle terminus of the carbon dioxide snow nozzle 17, and the terminus of outer body 27.

As shown in FIG. 3, the aperture from which the gas stream escapes preferably substantially surrounds at least one of the carbon dioxide snow stream and the carbon dioxide snow nozzle. The carbon dioxide snow cleaning apparatus may further comprise a heater (not shown) to heat the gas stream.

The first portion of the gas stream 24, the carbon dioxide snow stream 19, and second portion of the gas stream 25 are illustrated in FIG. 3, wherein the apparatus is being moved across the front side Ra of the EUV reticle R from right to left.

As the charged carbon dioxide snowflakes contact the particles to be removed from the EUV reticle, the charge carried by the carbon dioxide stream is transferred to the particles. This charge transfer is particularly effective where the particles have lower ionization energy than carbon dioxide. The particles therefore become charged through their contact with the carbon dioxide snow stream.

A charge may also build up on the surface to be cleaned through charge transfer on contact with the charged carbon dioxide snow stream. In this way, both the surface to be cleaned and the particles to be removed from the surface become charged. An additional force of repulsion is therefore created between the charged particles, and the charged surface to be cleaned. Both the particles and the surface to be cleaned are charged with equal sign (i.e. both positively charged, or both negatively charged) as determined by charge transferred by the charged carbon dioxide snowflakes on impact. The resulting repulsive forces between the particles and the surface therefore accelerate the rate at which the particles are removed from the surface.

FIG. 4 is a schematic illustrating the transfer of charge from carbon dioxide snowflakes 29 of carbon dioxide snow stream 19 to contaminant particles on the front side Ra of EUV reticle R. FIG. 4 shows the charging element 20 charging the carbon dioxide snowflakes positively as they are formed on exit from the carbon dioxide snow nozzle 17. A positively charged carbon dioxide snowflake 29 approaches a particle 30 on the surface Ra. Upon contact of snowflake 29 with the particle 30, the carbon dioxide snowflake 29 sublimes and the charge thereof is transferred to the particle 30. The EUV reticle surface Ra may also accumulate a charge as a result of contact with the charged carbon dioxide snowflakes 29. The repulsive forces between the particle 30 and the surface Ra causes particle 30 to dislodge from the surface as a positively charged particle 30a.

Collection surface 18 is provided with a negative charge, and the positively charged particle 30a is attracted to the negatively charged collection surface 18. The particle 30a is then neutralised and becomes a negatively charged particle bound to collection surface 18. Although FIG. 4 illustrates the positive charging of the carbon dioxide snow stream, it will be appreciated that the charging element may alternatively negatively charge the carbon dioxide snow stream, and that the collection surface can be a positively charged collection surface.

In some embodiments, the carbon dioxide snow cleaning apparatus further comprises a charge additive source to provide a charge additive. FIG. 3 illustrates a charge additive source 26 being in fluid connection with the carbon dioxide snow nozzle 17. Preferably, the carbon dioxide snow stream forms such that the carbon dioxide snowflakes thereof comprise the charging additive. In FIG. 3, the charge additive source 26 provides charge additive directly into the carbon dioxide provided by the carbon dioxide source 16. As such, the charge additive is mixed with the carbon dioxide. Preferably the charging element 20 charges the both the charging additive and the carbon dioxide snow to provide a charged carbon dioxide snow stream comprising carbon dioxide snow and a charge additive. However, the charging additive may alternatively be charged by a different charging element to that which charges the carbon dioxide snow, if desired. The carbon dioxide itself may be uncharged, with the charge being carried by the charging additive.

The charging additive may be any suitable species which is capable of being charged. Suitable charging additives include water, ice, methanol, ethanol, isopropanol and propanol, or any other suitable additive. Advantageously, the provision of a charging additive may provide additional enhancements to the cleaning properties of the carbon dioxide snow stream. Furthermore, advantageously, a charging additive may increase the overall charge of a carbon dioxide snowflake, wherein the carbon dioxide snowflake comprises carbon dioxide and said charging additive. By increasing the overall charge of the carbon dioxide snowflakes, the amount of charge transferred to the particle to be cleaned and the surface to be cleaned can be increased, therefore increasing the repulsive forces between there between. It is preferable that the charging additive is volatile, such that it evaporates naturally from the surface to be cleaned without the need for drying.

A collection surface 18 is also provided in proximity to the surface to be cleaned, as illustrated in FIG. 2A. The collection surface collects the particles as they are dislodged from the surface to be cleaned, and preferably collects the particles before they are transferred elsewhere in the lithography apparatus.

As shown in FIG. 2A, in some embodiments, the collection surface may substantially surround the carbon dioxide snow stream, thereby enclosing a space between the surface to be cleaned, the collection surface and the carbon dioxide snow stream. By enclosing the space in which the particle is removed from the surface of the EUV reticle, the particle cannot escape to other areas of the lithography apparatus and is therefore trapped.

In some embodiments, the collection surface 18 is positioned to collect particles which are deflected away from the surface to be cleaned by the force of the carbon dioxide snow stream and optionally, the gas stream, as shown schematically in FIG. 2B.

Preferably the collection surface is charged with opposite sign to the charge carried by the particles removed from the EUV reticle, thereby creating a force of attraction between the collection surface and the collection surface. The collection surface can therefore be positively or negatively charged. For example, if the particle on the surface of the EUV reticle was positively charged, and the surface of the EUV reticle was also positively charged, the repulsive forces between the particle and the surface would facilitate dislodgement of the particle. The positively charged particle would then be attracted to a negatively charged collection surface in near proximity. The particle would therefore be collected as it is dislodged from the EUV reticle to be cleaned.

Although a single collection surface is described herein, it will be appreciated that the apparatus according to the first aspect of the present invention may comprise a plurality of collection surfaces. Said plurality of collection surfaces may comprise different types of collection surface, as described below.

The apparatus shown in FIGS. 2 to 4 may be used in a method of cleaning a surface comprising the steps of:
(i) passing a stream of carbon dioxide out of a carbon dioxide snow nozzle to form a carbon dioxide snow stream;
(ii) charging the carbon dioxide snow stream;
(iii) directing the charged carbon dioxide snow stream onto the surface to be cleaned;
(iv) collecting particles removed by the charged carbon dioxide snow stream from the surface to be cleaned on a collection surface.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. A carbon dioxide snow cleaning apparatus comprising: a carbon dioxide source; a carbon dioxide snow nozzle in fluid communication with the carbon dioxide source; a charging element and a collection surface.

2. A carbon dioxide snow cleaning apparatus according to clause 1 wherein the collection surface is electrically charged.

3. A carbon dioxide snow cleaning apparatus according to clause 1 wherein the collection surface is electrostatically charged.

4. A carbon dioxide snow cleaning apparatus according to any preceding clause wherein the collection surface is adjacent the carbon dioxide snow nozzle and/or wherein the collection surface is located substantially between the carbon dioxide snow nozzle and the surface to be cleaned.

5. A carbon dioxide snow cleaning apparatus according to any preceding clause wherein the collection surface substantially surrounds the carbon dioxide snow nozzle.

6. A carbon dioxide snow cleaning apparatus according to any one of clauses 1 to 5 wherein the charging element is a source of electrons, a source of ionizing radiation, a plasma source, or a triboelectric charging surface.

7. A carbon dioxide snow cleaning apparatus according to any preceding clause further comprising a charging additive source to provide a charging additive.

8. A carbon dioxide snow cleaning apparatus according to clause 7 wherein the carbon dioxide snow stream comprises a charging additive which becomes charged by the charging element.

9. A carbon dioxide snow cleaning apparatus according to clause 7 or clause 8 wherein the charging additive is selected from the group comprising water, ice, methanol, ethanol, isopropanol, and propanol, or any other suitable additive.

10. A carbon dioxide snow cleaning apparatus according to any preceding clause wherein the charging element is adjacent the carbon dioxide snow nozzle.

11. A carbon dioxide snow cleaning apparatus according to any preceding clause wherein the charging element substantially surrounds the carbon dioxide snow nozzle.

12. A carbon dioxide snow cleaning apparatus according to any preceding clause further comprising a gas stream substantially surrounding the carbon dioxide snow nozzle.

13. A carbon dioxide snow cleaning apparatus according to clause 12 wherein at least a portion of the gas stream is situated between the carbon dioxide snow nozzle and the collection surface.

14. A carbon dioxide snow cleaning apparatus according to clause 12 or clause 13 further comprising a heater to heat the gas stream.

15. A carbon dioxide snow cleaning apparatus according to any preceding clause further comprising a voltage source wherein a voltage is applied between the collection surface and the carbon dioxide snow nozzle.

16. A method of cleaning a surface, the method comprising the steps of: (i) passing a stream of carbon dioxide out of a carbon dioxide snow nozzle to form a carbon dioxide snow stream;
  (ii) charging the carbon dioxide snow stream;
  (iii) directing the charged carbon dioxide snow stream onto the surface to be cleaned;
  (iv) collecting particles removed by the charged carbon dioxide snow stream from the surface to be cleaned on a collection surface.

17. A method according to clause 16 wherein the collection surface is electrically charged.

18. A method according to clause 16 wherein the collection surface is electrostatically charged.

19. A method according to any one of clauses 16 to 18 wherein the carbon dioxide snow stream is charged by a source of electrons, by a source of ionizing radiation, by a plasma source the carbon dioxide snow stream being passed through at least a portion of the plasma of the plasma source, or by impingement with a triboelectric charging surface.

20. A method according to any one of clauses 16 to 19, further comprising providing a charging additive.

21. A method according to clause 20 wherein the charging additive is charged by at least one of a source of electrons, a source of ionizing radiation, a plasma source, or impingement with a triboelectric charging surface.

22. A method according to clause 20 or clause 21 wherein the charging additive is selected from the group comprising water, ice, methanol, ethanol, isopropanol and propanol, or any other suitable additive.

23. A method according to any one of clauses 16 to 22 wherein a gas stream is provided, the gas stream directing the carbon dioxide snow stream onto the surface to be cleaned.

24. A method according to clause 23 wherein the gas stream is provided by an outlet which substantially surrounds the carbon dioxide nozzle, wherein optionally the outlet is situated between the carbon dioxide snow nozzle and the collection surface.

25. A method according to clause 23 or clause 24 wherein the gas stream is heated.

26. A method according to any one of clauses 16 to 25 wherein a voltage is applied between the collection surface and the carbon dioxide snow nozzle, wherein the voltage is supplied by a voltage source.

27. A method according to any one of clauses 16 to 26 wherein the surface to be cleaned is a surface of a lithographic apparatus, which may be n EUV lithography apparatus.

28. A method according to clause 27 wherein the surface to be cleaned is an EUV reticle of an EUV lithography apparatus.

29. A method according to clause 28 wherein the surface to be cleaned is one or more of the front side of the EUV reticle, the backside of the EUV reticle, and the sides of the EUV reticle.

30. A method according to clause 28 or clause 29 wherein the EUV reticle is cleaned inside the EUV lithography apparatus.

31. A method according to any of clauses 16 to 30, wherein the surface is inspected in situ and cleaning is actioned when a level of contaminants reaches or exceeds a predetermined level.

32. The use of the apparatus according to any one of clauses 1 to 15 or a method according to any one of clauses 16 to 30 to clean a surface of a lithographic apparatus, which may be an EUV lithography apparatus.

33. The use according to clause 32, wherein the surface is a reticle.

34. The use according to clause 33, wherein the surface is one or more of the front side of the reticle the backside of the reticle and the sides of the reticle.

The invention claimed is:

1. A carbon dioxide snow cleaning apparatus comprising:
a carbon dioxide source configured to produce carbon dioxide;
a carbon dioxide snow nozzle in fluid communication with the carbon dioxide source such that a carbon dioxide snow stream exits the carbon dioxide snow nozzle and is directed onto a surface to be cleaned;
a charging element configured to charge molecules of the carbon dioxide snow stream; and
a collection surface configured to collect particles removed by the carbon dioxide snow stream from the surface to be cleaned.

2. The carbon dioxide snow cleaning apparatus according to claim 1 wherein the collection surface is electrically charged.

3. The carbon dioxide snow cleaning apparatus according to claim 1 wherein the collection surface is electrostatically charged.

4. The carbon dioxide snow cleaning apparatus according to claim 1 wherein the collection surface is adjacent the carbon dioxide snow nozzle and/or wherein the collection surface is located substantially between the carbon dioxide snow nozzle and a surface to be cleaned.

5. The carbon dioxide snow cleaning apparatus according to claim 1 wherein the collection surface substantially surrounds the carbon dioxide snow nozzle.

6. The carbon dioxide snow cleaning apparatus according to claim 1 wherein the charging element is a source of electrons, a source of ionizing radiation, a plasma source, or a triboelectric charging surface.

7. The carbon dioxide snow cleaning apparatus according to claim 1 further comprising a charging additive source configured to provide a charging additive.

8. The carbon dioxide snow cleaning apparatus according to claim 1 wherein the carbon dioxide snow stream comprises a charging additive which becomes charged by the charging element.

9. The carbon dioxide snow cleaning apparatus according to claim 7 wherein the charging additive is selected from the group comprising water, ice, methanol, ethanol, isopropanol, and propanol, or any other suitable additive.

10. The carbon dioxide snow cleaning apparatus according to claim 1 wherein the charging element is adjacent the carbon dioxide snow nozzle.

11. The carbon dioxide snow cleaning apparatus according to claim 1 wherein the charging element substantially surrounds the carbon dioxide snow nozzle.

12. The carbon dioxide snow cleaning apparatus according to claim 1 further comprising a gas stream substantially surrounding the carbon dioxide snow nozzle.

13. The carbon dioxide snow cleaning apparatus according to claim 12 wherein at least a portion of the gas stream is situated between the carbon dioxide snow nozzle and the collection surface.

14. The carbon dioxide snow cleaning apparatus according to claim 12 further comprising a heater to heat the gas stream.

15. The carbon dioxide snow cleaning apparatus according to claim 1 further comprising a voltage source wherein a voltage is applied between the collection surface and the carbon dioxide snow nozzle.

16. A method of cleaning a surface, the method comprising:
(i) passing a stream of carbon dioxide out of a carbon dioxide snow nozzle to form a carbon dioxide snow stream;
(ii) charging the carbon dioxide snow stream;
(iii) directing the charged carbon dioxide snow stream onto the surface to be cleaned; and
(iv) collecting particles removed by the charged carbon dioxide snow stream from the surface to be cleaned on a collection surface.

17. The method according to claim 16 wherein the collection surface is electrically charged.

18. The method according to claim 16 wherein the collection surface is electrostatically charged.

19. The method according to claim 16 wherein the carbon dioxide snow stream is charged by a source of electrons, by a source of ionizing radiation, by a plasma source with the carbon dioxide snow stream being passed through at least a portion of the plasma of the plasma source, or by impingement with a triboelectric charging surface.

20. A lithographic apparatus comprising a carbon dioxide snow cleaning apparatus according to claim 1.

21. The carbon dioxide snow cleaning apparatus according to claim 1 wherein the charging element is configured to charge the carbon dioxide snow in the carbon dioxide snow stream during the formation of the carbon dioxide snow stream or after the formation of the carbon dioxide snow stream.

22. The carbon dioxide snow cleaning apparatus according to claim 1 wherein the charging element is configured to charge the carbon dioxide produced by the carbon dioxide source prior to the carbon dioxide snow stream being formed.

* * * * *